(12) United States Patent
Lichtenstein et al.

(10) Patent No.: US 6,866,908 B2
(45) Date of Patent: Mar. 15, 2005

(54) INTERFERENCE MITIGATION THROUGH CONDUCTIVE THERMOPLASTIC COMPOSITE MATERIALS

(75) Inventors: Parker Ross Lichtenstein, Newark, OH (US); Hong Peng, Pickerington, OH (US)

(73) Assignee: Parker-Hannifin Corporation, Cleveland, OH (US)

( * ) Notice: Subject to any disclaimer, the term of this patent is extended or adjusted under 35 U.S.C. 154(b) by 34 days.

(21) Appl. No.: 10/387,808

(22) Filed: Mar. 12, 2003

(65) Prior Publication Data

US 2003/0175454 A1 Sep. 18, 2003

Related U.S. Application Data

(62) Division of application No. 09/717,368, filed on Nov. 20, 2000, now abandoned.

(51) Int. Cl.[7] ................................................. H05K 9/00
(52) U.S. Cl. ................................ 428/35.7; 174/35 GC; 361/796; 361/816; 428/901
(58) Field of Search ...................... 174/35 GC; 361/796, 361/816; 428/35.7, 901

(56) References Cited

U.S. PATENT DOCUMENTS 5,566,055 A * 10/1996 Salvi, Jr. ..................... 361/816
6,384,128 B1 * 5/2002 Wadahara et al. .......... 524/496

* cited by examiner

Primary Examiner—Sandra M. Nolan
(74) Attorney, Agent, or Firm—John A. Molnar, Jr..

(57) ABSTRACT

An electromagnetic radiation interference mitigation shield is provided for an electronic circuit component. The shield includes a body formed from an electrically and thermally conductive composite material characterized by a volume resistivity ranging from about 0.1 to about 1,000 ohm-cm and a thermal conductivity ranging from about $10 \times 10^{-4}$-cal.-cm./sec.-cm.$^2$-° C. to about $30 \times 10^{-4}$-cal.-cm./sec.-cm.$^2$-° C.

9 Claims, 1 Drawing Sheet

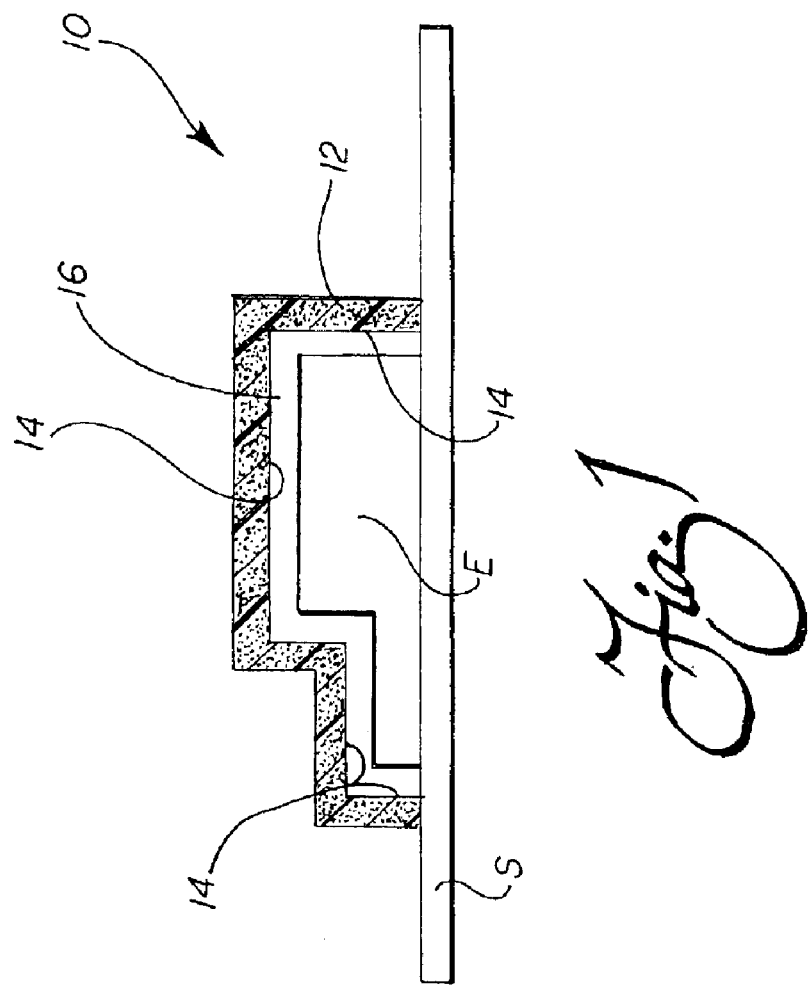

INTERFERENCE MITIGATION THROUGH CONDUCTIVE THERMOPLASTIC COMPOSITE MATERIALS

RELATED CASES

This application is a divisional of U.S. patent application Ser. No. 09/717,368, filed Nov. 20, 2000, now abandoned, the disclosure of which is incorporated herein by reference.

TECHNICAL FIELD AND INDUSTRIAL APPLICABILITY OF THE INVENTION

The present invention relates generally to electromagnetic radiation interference mitigation and, more particularly, to conductive thermoplastic composite materials that provide such interference mitigation by means of capacitive and/or inductive electrical coupling.

BACKGROUND OF THE INVENTION

In today's electronic age and particularly as a result of advances in digital technologies, electrical malfunctions resulting from electromagnetic radiation such as radio frequency interference (RFI) have been proliferating. Recently, ever-increasing numbers of cordless and cellular phone users have compounded the problem. As a result, interference with clear communication and the shielding of communication equipment from stray radio frequency signals has become a primary concern.

As a result, many efforts have been made in recent years to mitigate RFI. Examples of these efforts are found in U.S. Pat. Nos. 5,371,404 to Juskey et al. and 5,338,617 to Workinger et al. The Juskey et al. patent discloses a semiconductor device package incorporating a thermally and electrically conductive plastic material containing metal particles that is transfer molded to encapsulate the semiconductor device. The conductive plastic material is electrically connected to the circuit ground to shield the semiconductor device from radio frequency energy and is mechanically attached to the semiconductor device to dissipate heat. Fins may be molded into the plastic conductive material for heat dissipation. The Workinger et al. patent discloses a radio frequency shield that underlies the conductors of a radio frequency assembly but does not enclose them. The shield is formed from metal powder particles in a plastic resin.

While the shields disclosed in the Juskey et al. and Workinger et al. patents are useful for their intended purpose, they are not without their shortcomings. Specifically, the Juskey et al. device package requires transfer molding so that the semiconductor device is encapsulated in the thermally and electrically conductive plastic material. This transfer molding requires the application of heat to the semiconductor device. This limits the selection of shielding materials to relatively low temperature thermoplastic materials since higher temperature thermoplastic materials risk potential damage to the semiconductor device through the application of high temperatures. The Workinger et al. shield does not enclose the conductors or component to be shielded and as such fails to provide sufficient shielding for many applications.

Thus, a need is identified for an improved means of mitigating electromagnetic radiation including radio frequency interference overcoming the above-identified disadvantages and limitations of the prior art.

SUMMARY OF THE INVENTION

In accordance with the purposes of the present invention as described herein, an electromagnetic radiation interference mitigation shield for an electronic circuit component is provided. That shield includes a body formed from an electrically and thermally conductive composite material characterized by a volume resistivity ranging from about 0.1 to about 1,000 ohm-cm and a thermal conductivity ranging from about $10 \times 10^{-4}$-cal.-cm./sec.-cm.$^2$-° C. to about $30 \times 10^{-4}$-cal.-cm./sec.-cm.$^2$-° C.

The composite material of the body includes a plastic/polymer selected from a group consisting of Acrylonitrile Butadiene Styrene (ABS), Polycarbonate (PC), PC/ABS, Polypropylene (PP), Nylon (PA), Styrene Acrylonitrile (SAN), Polysulfone (PSU), Polybutylene Terephthalate (PBT), Polyethylene Terephthalate (PET), Polyphenylene Sulfide (PPS), Polyimides (PI), Polyester Thermoplastic Elastomer (TPE), Acrylic (PMMA), Rigid Thermoplastic Polyurethane (RTPU), Liquid Crystal Polymer (LCP), Phenolics, Polyvinyl Chloride (PVC), Styrenics, Cured Polyester and Epoxy resins, rubber, silicone RTV, and other elastomers, or any other similar thermoplastic, thermoset, or room temperature curing plastics or mixtures thereof.

Additionally, the body includes conductive particles selected from a group consisting of conductive doping chemicals, metal-coated/plated carbon/glass/plastic fibers, metal-coated/plated carbon/glass/plastic particles, conductive metal fibers, conductive metal particles, metallic salts and any mixtures thereof. The conductive particles are provided in concentrations ranging from about 5% to about 50% by weight of the composite material.

Metals utilized to coat or plate the carbon, glass or plastic fibers or utilized themselves as particles in the composite material are selected from a group consisting of nickel, copper, iron, silver, gold, tin, zinc, lead, aluminum, brass, bronze, stainless steel, any mixtures thereof, and any other electrically conductive metal(s) not listed herein.

Typically, the body of the shield includes a cavity for receiving the electronic circuit component to be shielded. Walls of the body defining the cavity are adjacent to but not physically touching the electronic circuit component. In most applications the walls are within 0.5 inches or less of the electronic circuit component when the shield is in the operative position relative to the electronic circuit component to be shielded.

In accordance with another aspect of the present invention, the electronic radiation interference mitigation shield for an electronic circuit component may be described as a body of electrically and thermally conductive composite material formed from a plastic and conductive particles where the body has walls defining a cavity for receiving the electronic circuit component and the walls are within about 0.5 inches or less of the electronic circuit component but not touching the electronic circuit component.

Still further, the invention may be described as an electronic radiation interference mitigation shield for an electronic circuit component comprising a body of electrically and thermally conductive composite material formed from a plastic selected from but not limited to a group consisting of acrylonitrile butadiene styrene, polycarbonate, propylene, nylon, styrene acrylonitrile, polysulfone, polybutylene terephthalate, polyethylene terephthalate, polyphenylene sulfide, polyimides, polyester thermoplastic elastomer, acrylic, polyvinyl chloride, styrenics, cured polyester and epoxy resins, rubber, silicone RTV and any mixtures thereof and conductive particles selected from a group consisting of conductive doping chemicals, metal-coated/plated carbon/glass/plastic fibers, metal-coated carbon/glass/plastic particles, conductive metal fibers, conductive metal particles, metallic salts and any mixtures thereof wherein the conductive particles are provided at concentrations ranging from about 5% to about 50% by weight of the composite material.

In accordance with yet another aspect of the present invention a method of shielding an electronic circuit component is provided. The method comprises the step of positioning over the electronic circuit component a separate body of electrically and thermally conductive composite material formed from a plastic and conductive particles so that walls of the body forming a cavity therein are positioned within about 0.5 inches of the electronic circuit component.

BRIEF DESCRIPTION OF THE DRAWING

The accompanying drawing incorporated in and forming a part of the specification, illustrates several aspects of the present invention, and together with the description serves to explain the principles of the invention. In the drawing:

FIG. 1 is a partially schematical, cross-sectional view of the present invention showing the electromagnetic radiation interference mitigation shield positioned on a circuit board substrate over an electronic circuit component to be shielded.

Reference will now be made in detail to the present preferred embodiment of the invention, an example of which is illustrated in the accompanying drawing.

DETAILED DESCRIPTION OF THE INVENTION

Reference is now made to FIG. 1 showing the electromagnetic radiation interference mitigation shield 10 of the present invention for shielding an electronic circuit component such as shown at E mounted to a circuit board substrate S.

The shield 10 comprises a body 12 having a series of walls 14 that define a cavity 16 substantially conforming to the shape of the electronic circuit component E to be shielded. Specifically, the shield 10 is positioned over the electronic circuit component E so that the walls 14 defining the cavity 16 are within 0.5 inches or less of the exterior of the electronic circuit component E being shielded. The body 12 of the shield 10 is then anchored in position on the substrate S by adhesive, fasteners or any other appropriate means known in the art.

The body 12 of the shield 10 is formed from an electrically and thermally conductive composite material. That material is characterized by a volume resistivity ranging from about 0.1 to about 1,000 ohm-cm and a thermal conductivity ranging from about $10 \times 10^{-4}$-cal.-cm./sec.-cm.$^2$-° C. to about $30 \times 10^{-4}$-cal.-cm./sec.-cm.$^2$-° C.

The body 12 includes a plastic/polymer selected from a group consisting of Acrylonitrile Butadiene Styrene (ABS), Polycarbonate (PC), PC/ABS, Polypropylene (PP), Nylon (PA), Styrene Acrylonitrile (SAN), Polysulfone (PSU), Polybutylene Terephthalate (PBT), Polyethylene Terephthalate (PET), Polyphenylene Sulfide (PPS), Polyimides (PI), Polyester Thermoplastic Elastomer (TPE), Acrylic (PMMA), Rigid Thermoplastic Polyurethane (RTPU), Liquid Crystal Polymer (LCP), Phenolics, Polyvinyl Chloride (PVC), Styrenics, Cured Polyester and Epoxy resins, rubber, silicone RTV, and other elastomers and any mixtures thereof.

The body also includes conductive particles selected from a group consisting of conductive doping chemicals (e.g., iron compounds, arsenic compounds, alkali metals), metal-coated/plated carbon/glass/plastic fibers (e.g., nickel, silver, copper plated), metal-coated carbon/glass/plastic particles (e.g., nickel, silver, copper plated), conductive metal fibers, conductive metal particles, metallic salts (e.g, ferric, diazonium) and any mixtures thereof. The metals used as fibers or to coat or plate carbon, glass or plastic include nickel, copper, iron, silver, gold, tin, zinc, lead, aluminum, brass, bronze, stainless steel, and any mixtures thereof. Of course, while not specifically listed other electrically conductive metals including various alloys could be utilized. The conductive particles are provided in the body 12 of the shield 10 in concentrations ranging from about 5% to about 50% by weight of the composite material.

It should be appreciated that the shield 10 may be easily molded to any desired shape for any particular application. Accordingly, the present invention provides application specific or designed shielding customized to any particular application. This allows increased electromagnetic/radio frequency interference shielding of specific circuitry "hot spots". By this, it is meant that the RFI and EMI shielding may be concentrated at the electronics that are the source of the radiation where that radiation may be most easily isolated and contained. As the shield 10 is custom molded to the required shape for the shielding application, shielding materials are minimized. Further, since a composite material is utilized for the body 12 of the shield 10, undesirable energy reflections typical of metal and metal plated plastic RF shields are avoided. This is because the shield accomplishes the removal of undesirable EM or RF energy by effecting an inductive and/or capacitive coupling of the walls 14 of the body 12 to the radiating RF signal, thereby causing the energy to be absorbed into the conductive plastic and conducted into adjoining areas of the main electronics housing (e.g., the substrate S). This produces a heating effect proportional to the level of energy absorbed. The heat is then gradually dissipated from the shield via radiation to the surrounding environment.

In order to be most effective, the walls 14 of the shield 10 are positioned in close proximity to the electronic circuit component E to be shielded. The maximum distance between the walls 14 and the component E is about 0.5 inches or less. For best results, the shield 10 is not, however, positioned in direct contact or touching the electronic circuit component E as direct thermal heating of the shield from the electronic component E being shielded could adversely affect the energy absorbing and heat dissipating properties of the shield.

It should be appreciated that as a result of the shield 10 shielding through absorption rather than reflection, RF energy gasketing is not necessary to prevent gap or slot leakage of RF radiation to surrounding environments. Thus, this additional expense characteristic of metal and metal plated plastic shields is avoided. Further, since the shield 10 is separate from and not encapsulated around the electronic component E it should be appreciated that the electronic component E is not subjected to high temperatures during transform molding that would otherwise be necessary to complete encapsulation. Further, the shield 10 may be removed if desired to access the underlying electronic circuit component for maintenance or any other purpose.

The foregoing description of a preferred embodiment of this invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed:

1. An electromagnetic radiation interference mitigation shield for shielding assembly including an electronic circuit component mounted on a circuit board, said assembly comprising:

a shield consisting essentially of a body formed from an electrically and thermally conductive composite material including a plastic/polymer and conductive particles, said body being positioned on the circuit board over the electronic circuit component, and said material being characterized by a volume resistivity ranging from about 0.1 to about 1.000 ohm-cm and a thermal conductivity ranging from about $10 \times 10^{-4}$-cal.-cm./sec.-cm.$^2$-° C. to about $30 \times 10^{-4}$-cal.-cm./sec.-cm.$^2$-° C.

2. The shielding assembly of claim 1 wherein said plastic/polymer is selected from a group consisting of acrylonitrile butadiene styrene, polycarbonate, propylene, nylon, styrene acrylonitrile, polysulfone, polybutylene terephthalate, polyethylene terephthalate, polyphenylene sulfide, polyimides, polyester thermoplastic elastomer, acrylic, polyvinyl chloride, styrenics, cured polyester and epoxy resins, rubber, silicone RTV and any thermoplastic, thermoset, or room temperature curing plastics or mixtures thereof.

3. The shielding assembly of claim 1 wherein said conductive particles are selected from a group consisting of conductive doping chemicals, metal-coated/plated carbon/glass/plastic fibers, metal-coated carbon/glass/plastic particles, conductive metal fibers, conductive metal particles, metallic salts and any mixtures thereof.

4. The shielding assembly of claim 3, wherein said conductive particles are provided in concentrations ranging from about 5% to about 50% by weight.

5. The shielding assembly of claim 3, wherein said conductive particle metals are selected from a group consisting of nickel, copper, iron, silver, gold, tin, zinc, lead, aluminum, brass, bronze, stainless steel, other electrically conductive metals and any mixtures thereof.

6. The shielding assembly of claim 1, wherein said body includes walls defining a cavity, the electronic circuit component to be shielded being received within said cavity when said body is positioned on the circuit board over the component.

7. The shielding assembly of claim 6, wherein said walls are spaced within 0.5 inches or less from the electronic circuit component to be shielded but are not physically touching the electronic circuit component.

8. An electromagnetic radiation interference mitigation shielding assembly including an electronic circuit component mounted on a circuit board, said assembly comprising:

a shield consisting essentially of a body formed from electrically and thermally conductive composite material, said body being positioned on the circuit board over the electronic circuit component and said material being formed from a plastic/polymer and conductive particles, said plastic/polymer being selected from the group consisting of acrylonitrile/butadiene/styrene polymer, polycarbonate, polypropoylene, nylon, styrene/acrylonitrile polymer, polysulfone, polybutylene terephthalate, polyethylene terephthalate, polyphenylene sulfide, polyimide, polyester thermoplastic elastomer, acrylic polymer, polyvinyl chloride, styrenic polymer, cured polyester, cured epoxy resin, rubbers, silicone RTV polymer, thermoplastic, thermoset, or room temperature curing plastics or mixtures thereof, and said conductive particles being selected from a group consisting of conductive doping chemicals, metal-coated carbon, metal-plated carbon, metal-coated glass, metal-plated glass, metal-coated plastic, metal-plated plastic fibers metal-coated carbon particles, metal-coated glass particles, metal-coated plastic particles, conductive metal fibers, conductive metal particles, metallic salts and mixtures thereof, wherein said conductive particles are provided at concentrations ranging from about 5% to about 50% by weight, and said body is characterized by a volume resistivity of 0.1 to about 1,000 ohm-cm and thermal conductivity of about $10 \times 10^{-4}$-cal.-cm./sec.-cm$^2$-° C. to about $30 \times 10^{-4}$-cal.-cm./sec.-cm.$^2$-° C.

9. A method of shielding an electronic circuit component mounted on a circuit board, comprising:

positioning on the circuit board over the electronic circuit component a separate shield consisting essentially of a body of electrically and thermally conductive composite material formed from a plastic/polymer and conductive particles characterized by a volume resistivity ranging from about 0.1 to about 1,000 ohm-cm and a thermal conductivity ranging from about $10 \times 10^{-4}$-cal.-cm./sec.-cm.$^2$-° C. to about $30 \times 10^{-4}$-cal.-cm./sec.-cm.$^2$-° C. so that the walls of said body forming a cavity therein are positioned within about 0.5 inches of the electronic circuit component.

* * * * *